(12) United States Patent
Park et al.

(10) Patent No.: US 11,502,145 B2
(45) Date of Patent: Nov. 15, 2022

(54) METHOD OF FORMING DISPLAY ELECTRODES AND PIXEL DEFINING LAYERS WITHOUT AN INCREASE OF MASKS

(71) Applicant: Samsung Display Co., Ltd., Yongin-si (KR)

(72) Inventors: Gwuihyun Park, Yongin-si (KR); Pilsoon Hong, Yongin-si (KR); Chulwon Park, Yongin-si (KR); Koichi Sugitani, Yongin-si (KR); Hyungbin Cho, Yongin-si (KR); Hyein Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 197 days.

(21) Appl. No.: 16/899,124

(22) Filed: Jun. 11, 2020

(65) Prior Publication Data
US 2021/0111232 A1 Apr. 15, 2021

(30) Foreign Application Priority Data

Oct. 11, 2019 (KR) .................. 10-2019-0126292

(51) Int. Cl.
*H01L 27/32* (2006.01)
*H01L 51/00* (2006.01)
(Continued)

(52) U.S. Cl.
CPC ........ *H01L 27/3246* (2013.01); *H01L 27/322* (2013.01); *H01L 27/3248* (2013.01);
(Continued)

(58) Field of Classification Search
CPC ............... H01L 27/3246; H01L 27/322; H01L 27/3248; H01L 27/3258; H01L 27/3276;
(Continued)

(56) References Cited

U.S. PATENT DOCUMENTS

| | | | |
|---|---|---|---|
| 9,397,255 B2 | 7/2016 | Kimura | |
| 9,711,750 B1 * | 7/2017 | Kim | ................ H01L 27/3258 |

(Continued)

FOREIGN PATENT DOCUMENTS

| | | |
|---|---|---|
| CN | 110212007 | 9/2019 |
| EP | 3343634 | 7/2018 |

(Continued)

OTHER PUBLICATIONS

Extended European Search Report corresponding with European Patent / Application No. 20199500.8 dated Apr. 3, 2021.

*Primary Examiner* — Lex H Malsawma
*Assistant Examiner* — Eric W Jones
(74) *Attorney, Agent, or Firm* — Kile Park Reed & Houtteman PLLC

(57) ABSTRACT

A method of manufacturing a light-emitting display apparatus and a light-emitting display apparatus are provided. The method includes forming a first photosensitive layer on a conductive material layer, forming a pixel electrode by etching the conductive material layer by using the first photosensitive layer as a mask, ashing the first photosensitive layer disposed on the pixel electrode, forming a pixel defining layer that covers an edge portion of the pixel electrode and includes a first opening overlapping the ashed first photosensitive layer, removing the ashed first photosensitive layer disposed in the first opening, forming an intermediate layer including a functional layer and an emission layer on the pixel defining layer, and forming an opposite electrode on the intermediate layer.

13 Claims, 14 Drawing Sheets

(51) Int. Cl.
 *H01L 51/52* (2006.01)
 *H01L 51/56* (2006.01)

(52) U.S. Cl.
 CPC ...... *H01L 27/3258* (2013.01); *H01L 27/3276* (2013.01); *H01L 51/0023* (2013.01); *H01L 51/5284* (2013.01); *H01L 51/56* (2013.01); *H01L 51/5206* (2013.01); *H01L 2227/323* (2013.01)

(58) Field of Classification Search
 CPC . H01L 51/0023; H01L 51/5284; H01L 51/56; H01L 51/5206; H01L 2227/323
 USPC ...................................................... 257/40, 59
 See application file for complete search history.

(56) References Cited

U.S. PATENT DOCUMENTS

| | | | | |
|---|---|---|---|---|
| 10,734,597 | B2* | 8/2020 | Kim | ............... H01L 51/5253 |
| 10,930,518 | B2* | 2/2021 | Zhang | ............... H01L 51/0018 |
| 2010/0045173 | A1* | 2/2010 | Kwon | ............... H01L 51/5218 |
| | | | | 313/504 |
| 2014/0035456 | A1 | 2/2014 | Isa | |
| 2014/0354142 | A1 | 12/2014 | Jeong et al. | |
| 2015/0340413 | A1* | 11/2015 | Lee | ............... H01L 27/3246 |
| | | | | 257/40 |
| 2016/0104760 | A1 | 4/2016 | Maeda | |
| 2016/0307976 | A1* | 10/2016 | You | ............... H01L 27/3246 |
| 2017/0207416 | A1* | 7/2017 | Kim | ............... H01L 51/504 |
| 2017/0226294 | A1* | 8/2017 | Kim | ............... C08L 83/14 |
| 2017/0346036 | A1* | 11/2017 | Kim | ............... H01L 27/3288 |
| 2018/0102499 | A1 | 4/2018 | Pyo et al. | |
| 2018/0122877 | A1* | 5/2018 | Beak | ............... H01L 27/3248 |
| 2019/0198806 | A1 | 6/2019 | Im et al. | |

FOREIGN PATENT DOCUMENTS

| | | |
|---|---|---|
| EP | 3522216 | 8/2019 |
| JP | 6453422 | 1/2019 |
| KR | 10-0573134 | 4/2006 |
| KR | 10-2016-0008672 | 1/2016 |
| KR | 10-2019-0054420 | 5/2019 |

* cited by examiner

METHOD OF FORMING DISPLAY ELECTRODES AND PIXEL DEFINING LAYERS WITHOUT AN INCREASE OF MASKS

CROSS-REFERENCE TO RELATED APPLICATION(S)

This application claims priority to and benefits of Korean Patent Application No. 10-2019-0126292 under 35 U.S.C. § 119, filed on Oct. 11, 2019 in the Korean Intellectual Property Office, the entire contents of which are incorporated herein by reference.

BACKGROUND

1. Technical Field

One or more embodiments relate to a display apparatus, and more particularly, to a light-emitting display apparatus.

2. Description of the Related Art

An organic light-emitting diode display apparatus, which is a display apparatus for displaying images, has self-emission characteristics unlike a liquid crystal display apparatus. Therefore, since the organic light-emitting diode display apparatus does not require a separate light source, the thickness and weight of the organic light-emitting diode display apparatus may be reduced. Also, the organic light-emitting diode display apparatus may have high quality characteristics such as low power consumption, high luminance, and high response time.

SUMMARY

An organic light-emitting diode display apparatus as described above should have excellent contrast and luminance, but the contrast may be poor in bright external light. In order to prevent this limitation, a pixel defining layer having a certain color (for example, black or the like) may be formed. Dark spots may be generated by residues that occur in a process of forming a colored pixel defining layer. One or more embodiments may provide a light-emitting display apparatus and a manufacturing method thereof, whereby deterioration of characteristics for external light and defects caused by generation of dark spots may be prevented and manufacturing processes may be simplified. However, these limitations are merely examples, and the scope of the disclosure is not limited thereto.

Additional aspects will be set forth in the description which follows and, in part, will be apparent from the description, or may be learned by practice of the embodiments of the invention.

According to embodiments, a method of manufacturing a light-emitting display apparatus includes forming a first photosensitive layer on a conductive material layer, forming a pixel electrode by etching the conductive material layer by using the first photosensitive layer as a mask, ashing the first photosensitive layer disposed on the pixel electrode, forming a pixel defining layer that covers an edge portion of the pixel electrode and including a first opening overlapping the ashed first photosensitive layer, removing the ashed first photosensitive layer disposed in the first opening, forming an intermediate layer including a functional layer and an emission layer on the pixel defining layer, and forming an opposite electrode on the intermediate layer.

In an embodiment, the forming of the pixel defining layer may include forming a color material layer on the ashed first photosensitive layer, exposing a part of the color material layer, and forming the first opening by developing the exposed part of the color material layer.

The pixel defining layer may include a negative photosensitive material.

The method may further include curing the pixel defining layer after the forming of the first opening.

The pixel defining layer may further include a color pigment or carbon black.

In an embodiment, a shape of the first opening may be substantially the same as a shape of the pixel electrode in a plan view.

In an embodiment, the method may further include forming a thin-film transistor, and forming an insulating layer between the thin-film transistor and the pixel electrode. The forming of the insulating layer may include forming a contact hole for electrical connection between the thin-film transistor and the pixel electrode, and the first opening may overlap the contact hole.

The method may further include forming an optical functional layer including a color filter overlapping the first opening and a black matrix adjacent to the color filter, wherein the black matrix may overlap the contact hole.

In an embodiment, the method may further include forming a second photosensitive layer on the conductive material layer, and forming a wiring by etching the conductive material layer by using the second photosensitive layer as a mask.

The method may further include ashing the second photosensitive layer disposed on the wiring, wherein the forming of the pixel defining layer may include forming a second opening overlapping the ashed second photosensitive layer and spaced apart from the first opening.

The method may further include removing the ashed second photosensitive layer arranged in the second opening.

The method may further include forming an insulating layer overlapping the second opening and disposed between the wiring and the intermediate layer.

The method may further include forming a hole in a portion of the functional layer, which may overlap the wiring, wherein the opposite electrode may be in electrical contact with the wiring through the hole.

According to embodiments, a light-emitting display apparatus may include a substrate, a thin-film transistor on the substrate, a pixel electrode electrically connected to the thin-film transistor, a first insulating layer disposed between the thin-film transistor and the pixel electrode, a pixel defining layer covering an edge portion of the pixel electrode and including a first opening overlapping the pixel electrode, an intermediate layer including an emission layer overlapping the first opening and a functional layer, and an opposite electrode on the intermediate layer.

In an embodiment, the first insulating layer may include a contact hole for electrical connection between the thin-film transistor and the pixel electrode, and the first opening may overlap the contact hole.

The light-emitting display apparatus may further include an optical functional layer including a color filter overlapping the first opening, and a black matrix adjacent to the color filter and overlapping a part of the first opening.

The black matrix may overlap the contact hole.

In an embodiment, the pixel defining layer may further include a color pigment or carbon black.

In an embodiment, a shape of the first opening may be substantially the same as a shape of the pixel electrode when seen in a direction perpendicular to the substrate.

In an embodiment, a first distance from a first edge of the pixel electrode to a first edge of the first opening may be substantially the same as a second distance from a second edge of the pixel electrode to a second edge of the first opening.

In an embodiment, the light-emitting display apparatus may further include a wiring spaced apart from the pixel electrode, wherein the wiring and the pixel electrode may include a same material.

The pixel defining layer may further include a second opening covering an edge portion of the wiring and overlapping the wiring.

A shape of the second opening may be substantially the same as a shape of the wiring when seen in a direction perpendicular to the substrate.

The light-emitting display apparatus may further include a second insulating layer overlapping the second opening.

The second insulating layer may be disposed between the wiring and the intermediate layer.

The light-emitting display apparatus may further include a spacer disposed on the pixel defining layer, wherein the second insulating layer and the spacer may include a same material.

The pixel defining layer and the spacer may include different materials.

In an embodiment, light-emitting display apparatus may further include a driving thin-film transistor electrically connected to the thin-film transistor, an initialization thin-film transistor electrically connected to a gate electrode of the driving thin-film transistor or the pixel electrode, and an initialization voltage line electrically connected to the initialization thin-film transistor, wherein the wiring may include the initialization voltage line.

In an embodiment, the functional layer may include a hole overlapping the second opening.

The opposite electrode may be in electrical contact with the wiring through the hole.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
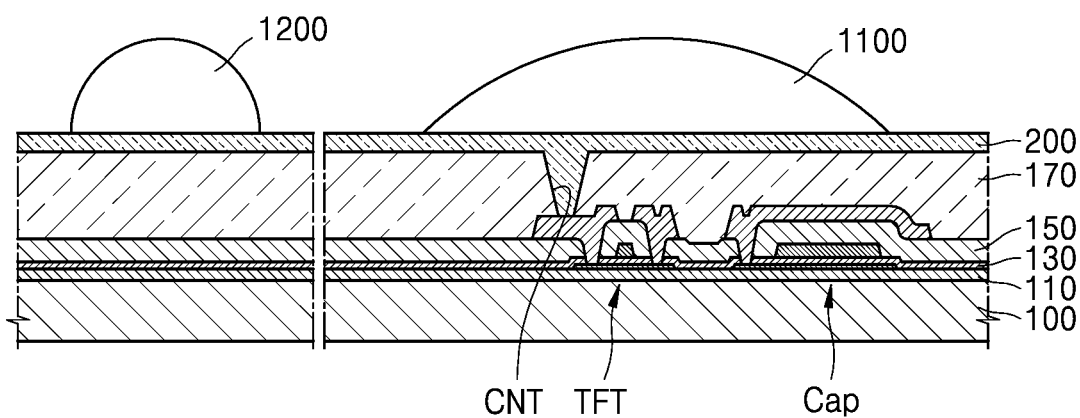
FIGS. 1 to 6 are schematic cross-sectional views illustrating a process of manufacturing a light-emitting display apparatus, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or".

Hereinafter, embodiments will be described in detail with reference to the accompanying drawings. In the following description, like reference numerals are assigned to like components, and redundant descriptions thereof will be omitted.

It will be understood that although the terms "first," "second," etc. may be used herein to describe various elements, these elements should not be limited by these terms. These terms are only used to distinguish one element from another.

As used herein, the singular forms "a," "an," "one," and "the" are intended to include the plural forms as well, unless the context clearly indicates otherwise.

It will be further understood that the terms "includes," "including," "contains," "containing," "comprises," and/or "comprising," used herein specify the presence of stated features or elements, but do not preclude the presence or addition of one or more other features or elements.

It will be understood that when a layer, region, or element is referred to as being "formed on," another layer, region, or element, it can be directly or indirectly formed on the other layer, region, or element. For example, intervening layers, regions, or elements may be present.

Sizes of elements in the drawings may be exaggerated for convenience of explanation. For example, since sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, it will be understood that when a film, layer, region, element, or component is referred to as being "connected to" or "coupled to" another film, layer, region, element, and component, it may be directly or indirectly connected or coupled to the other film, layer, region, element, or component. For example, intervening films, regions, or components may be present. In the following embodiments, it will be understood that when a film, layer, region, element, or component is referred to as being "electrically connected to" or "electrically coupled to" another film, layer, region, element, and component, it may be directly or indirectly electrically connected or coupled to the other film, layer, region, element, or component. For example, intervening films, layers, regions, elements, or components may be present.

FIGS. 1 to 6 are schematic cross-sectional views illustrating a process of manufacturing a light-emitting display apparatus, according to an embodiment.

Referring to FIG. 1, a conductive material layer 200 is formed above a substrate 100, and a first photosensitive layer 1100 and a second photosensitive layer 1200 are formed on the conductive material layer 200. In one embodiment, FIG. 1 illustrates that the conductive material layer 200 is formed on a planarization insulating layer 170. Before the conductive material layer 200 is formed, a thin-film transistor TFT and a storage capacitor Cap may be formed on the substrate 100.

The substrate 100 may include various materials, such as glass material, a metal material, or a plastic material (for example, polyethylene terephthalate (PET), polyethylene naphthalate (PEN), polyimide, or the like). A buffer layer 110, a gate insulating layer 130, an interlayer insulating layer 150, and the planarization insulating layer 170 may be formed on the substrate 100. The buffer layer 110 prevents impurities from penetrating into a semiconductor layer of the thin-film transistor TFT. The gate insulating layer 130 insulates the semiconductor layer and a gate electrode of the thin-film transistor TFT from each other. The interlayer insulating layer 150 insulates a source electrode, a drain electrode, and the gate electrode of the thin-film transistor TFT from each other. The planarization insulating layer 170 covers the thin-film transistor TFT and has an approximately flat upper surface.

The conductive material layer 200 may include a reflective film including silver (Ag), magnesium (Mg), aluminum (Al), platinum (Pt), palladium (Pd), gold (Au), nickel (Ni), neodymium (Nd), iridium (Ir), chromium (Cr), and/or any compound thereof. The conductive material layer 200 may include a reflective film including the above-mentioned material, and a transparent conductive film disposed above and/or below the reflective film. The transparent conductive film may include indium tin oxide (ITO), indium zinc oxide (IZO), zinc oxide (ZnO), indium oxide ($In_2O_3$), indium gallium oxide (IGO), aluminum zinc oxide (AZO), or the like. In one embodiment, the conductive material layer 200 may have a multi-layered structure in which an ITO film, an Ag film, and an ITO film are sequentially stacked.

The first photosensitive layer 1100 and the second photosensitive layer 1200 are spaced apart from each other. The second photosensitive layer 1200 may overlap a contact hole CNT configured to electrically connect the conductive material layer 200 to the thin-film transistor TFT.

The first photosensitive layer 1100 and the second photosensitive layer 1200 may include a positive photosensitive material. The first photosensitive layer 1100 and the second photosensitive layer 1200 may be formed by coating a photosensitive material layer on the conductive material layer 200 and performing an exposure process and a developing process using a mask including a light transmitting portion and a light blocking portion. A soft bake process may be performed at a first temperature between the process of coating the photosensitive material layer and the exposure process, and a post bake process may be performed at a second temperature after the first photosensitive layer 1100 and the second photosensitive layer 1200 are formed. The first temperature may be in a range of about 105° C. to about 110° C., and the second temperature may be greater than the first temperature. For example, the second temperature may be in a range of about 130° C. to about 135° C. Adhesion with the conductive material layer 200 may be increased through the post bake process.

Figure 2:
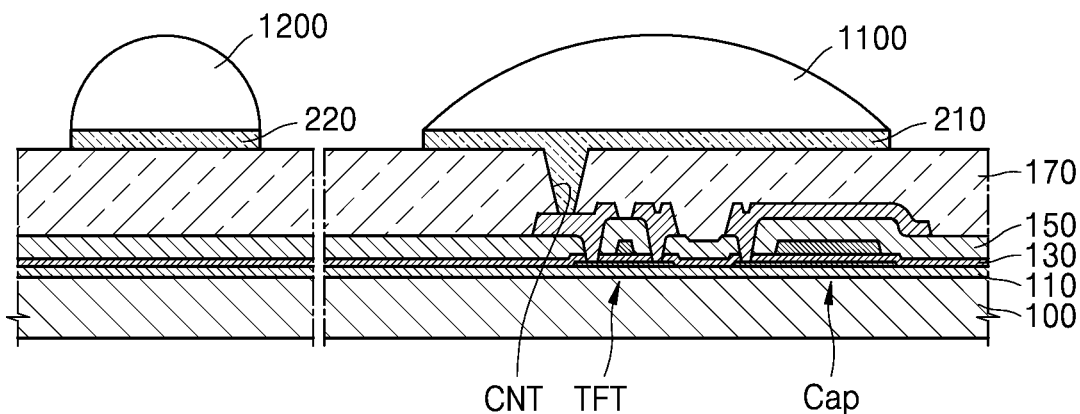

As illustrated in FIG. 2, the conductive material layer 200 may be etched to form a pixel electrode 210 and a wiring 220. An etching process (for example, a wet etching process) may be performed on the conductive material layer 200 by using the first photosensitive layer 1100 and the second photosensitive layer 1200 as a mask. The pixel electrode 210 may be formed under the first photosensitive layer 1100 through the etching process, and the wiring 220 may be formed under the second photosensitive layer 1200 through the etching process. The pixel electrode 210 may have a planar shape corresponding to the first photosensitive layer 1100, and the wiring 220 may have a planar shape corresponding to the second photosensitive layer 1200. For example, the pixel electrode 210 and the wiring 220 may include a same material. The pixel electrode 210 may be electrically connected to the thin-film transistor TFT through the contact hole CNT of the planarization insulating layer 170.

Figure 3:
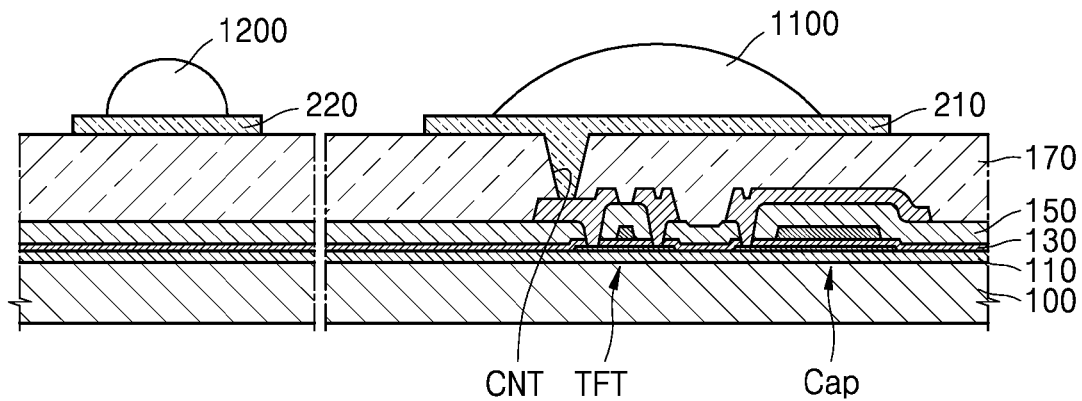

As illustrated in FIG. 3, the first photosensitive layer 1100 and the second photosensitive layer 1200 on the pixel electrode 210 and the wiring 220, respectively, may be ashed. The ashing may use oxygen. The ashed first photosensitive layer 1100 and the ashed second photosensitive layer 1200 may be reduced in size. An edge portion of the pixel electrode 210 and an edge portion of the wiring 220 may be exposed through the ashing process. The ashing is distinguished from a strip process. The ashing process may reduce the thicknesses and widths of the first photosensitive layer 1100 and the second photosensitive layer 1200 as a whole.

Figure 4:
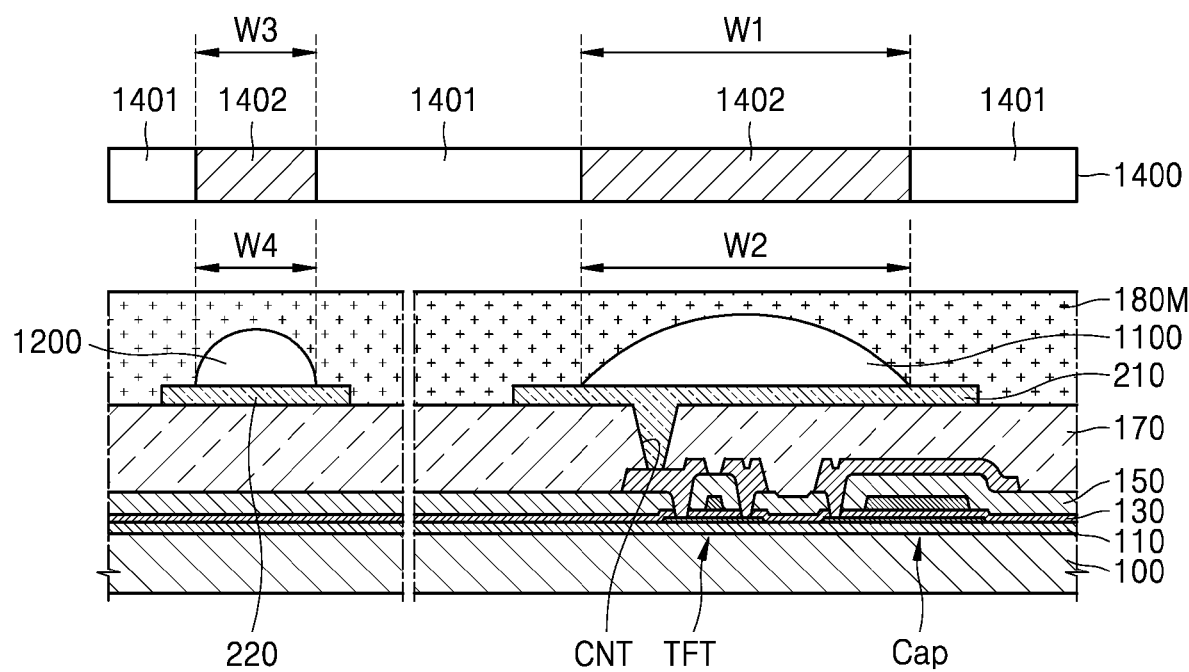

As illustrated in FIG. 4, a color material layer 180M may be coated on the ashed first photosensitive layer 1100 and the ashed second photosensitive layer 1200, and the color material layer 180M may be exposed by using a mask 1400. The mask 1400 may include a light transmitting portion 1401 and a light blocking portion 1402.

The color material layer 180M may be coated on the entire substrate 100 to cover the first photosensitive layer 1100 and the second photosensitive layer 1200. The color material layer 180M may have different photosensitivity from the first photosensitive layer 1100 and the second photosensitive layer 1200. The color material layer 180M may include a negative photosensitive material.

The light transmitting portion 1401 of the mask 1400 may not overlap the first photosensitive layer 1100 and the second photosensitive layer 1200, and the light blocking portion 1402 may overlap the first photosensitive layer 1100 and the second photosensitive layer 1200. Therefore, the portion of the color material layer 180M overlapping the first photosensitive layer 1100 and the second photosensitive layer 1200 may not be exposed, and the remaining portion of the color material layer 180M may be exposed.

Among the light blocking portions 1402 of the mask 1400, a first width W1 of the light blocking portion 1402 overlapping the first photosensitive layer 1100 may be equal to or similar to a second width W2 of the first photosensitive layer 1100. That the first width W1 is similar to the second width W2 may mean that a difference between the first width W1 and the second width W2 is less than about 10% of the first width W1 or less than about 10% of the second width W2.

Among the light blocking portions 1402 of the mask 1400, a third width W3 of the light blocking portion 1402 overlapping the second photosensitive layer 1200 may be equal to or similar to a fourth width W4 of the second photosensitive layer 1200. That the third width W3 is similar to the fourth width W4 may mean that a difference between the third width W3 and the fourth width W4 is less than about 10% of the third width W3 or less than about 10% of the fourth width W4.

Figure 5:
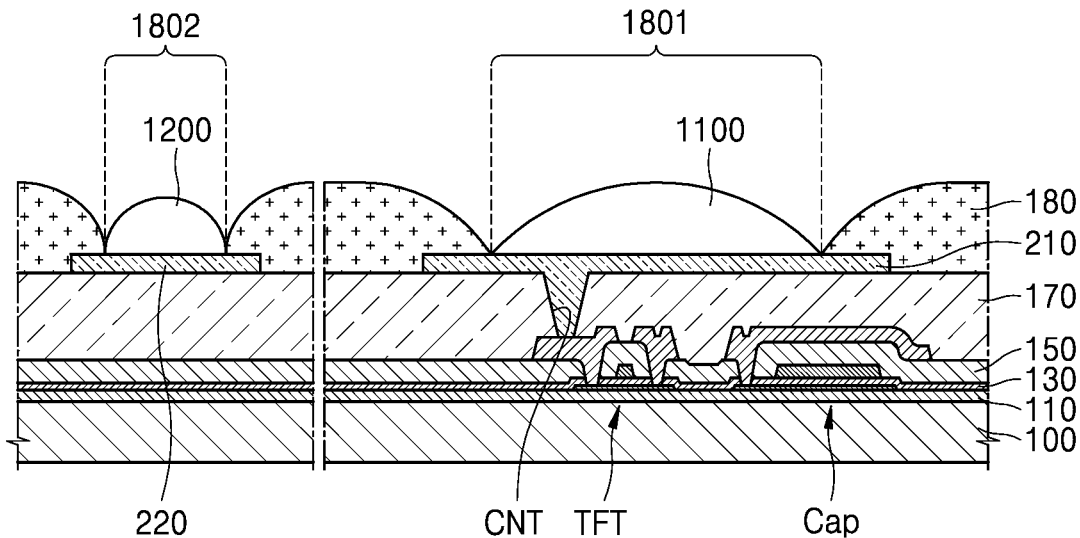

The exposed color material layer 180M may be developed. Through the developing, a pixel defining layer 180 including a first opening 1801 and a second opening 1802 may be formed above the substrate 100 as illustrated in FIG. 5.

The pixel defining layer 180 may have a color material. For example, the pixel defining layer 180 may have a color pigment, for example, a pigment of a certain color such as a white color or a black color. In one embodiment, the pixel defining layer 180 may have a black color. For example, the pixel defining layer 180 may include a polyimide (PI)-based binder and a pigment in which a red color, a green color, and a blue color are mixed. As another example, the pixel defining layer 180 may include a cardo-based binder resin and a mixture of a lactam black pigment and a blue pigment. As another example, the pixel defining layer 180 may include carbon black.

Since the pixel defining layer 180 is formed from the color material layer 180M, the pixel defining layer 180 may have negative photosensitivity. Since the pixel defining layer 180 includes the color pigment, the pixel defining layer 180 may prevent reflection of external light. The pixel defining layer 180 including the color pigment may prevent reflection of external light that travels from the outside toward the light-emitting display apparatus and may improve the contrast of the light-emitting display apparatus.

Figure 6:
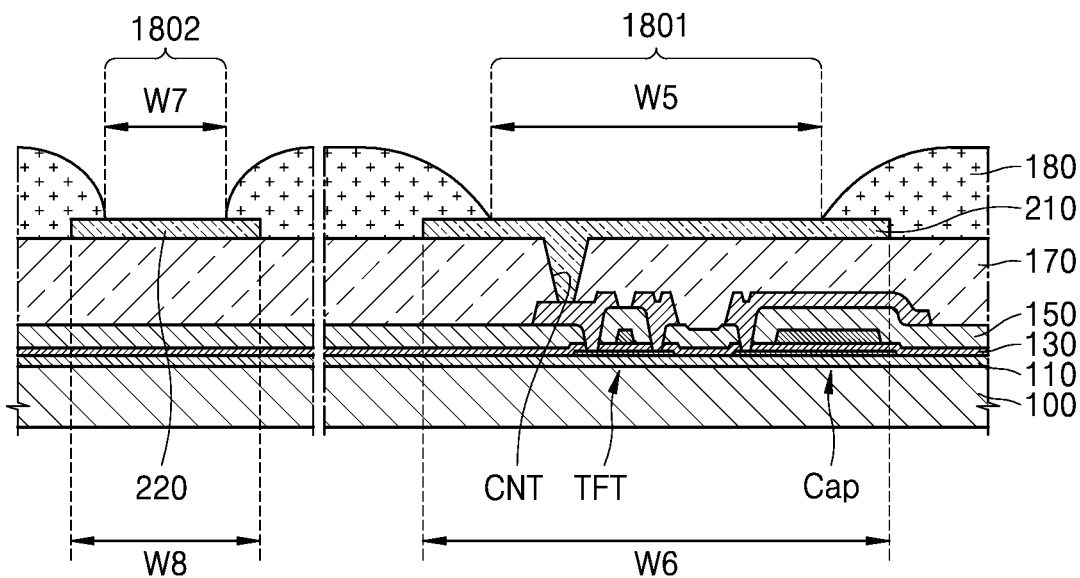

The substrate 100 on which the pixel defining layer 180, the first photosensitive layer 1100, and the second photosensitive layer 1200 are disposed may be entirely exposed. Since the first photosensitive layer 1100 and the second photosensitive layer 1200 include a positive photosensitive material, the first photosensitive layer 1100 and the second photosensitive layer 1200 are easily dissolved in a developing solution by the above-described exposure. The first photosensitive layer 1100 and the second photosensitive layer 1200 may be developed, and the first photosensitive layer 1100 and the second photosensitive layer 1200 may be removed as illustrated in FIG. 6. After the first photosensitive layer 1100 and the second photosensitive layer 1200 are removed through the developing, a curing process may be performed at a certain temperature.

The edge portion of the pixel electrode 210 may be covered with the pixel defining layer 180. The edge portion of the pixel electrode 210 may be in direct contact with the pixel defining layer 180 while overlapping the pixel defining layer 180. A portion of the pixel electrode 210 covered with the first photosensitive layer 1100 may be exposed when the first photosensitive layer 1100 is removed. A central portion of the pixel electrode 210 may overlap the first opening 1801 of the pixel defining layer 180 and may be exposed through the first opening 1801.

An edge portion of the wiring 220 may be covered with the pixel defining layer 180. The edge portion of the wiring 220 may overlap the pixel defining layer 180 and may be in direct contact with the pixel defining layer 180. A portion of the wiring 220 covered with the second photosensitive layer 1200 may be exposed when the second photosensitive layer 1200 is removed. A central portion of the wiring 220 may overlap the second opening 1802 of the pixel defining layer 180 and may be exposed through the second opening 1802.

A size of the first opening 1801 may be smaller than a size of the pixel electrode 210, and a size of the second opening 1802 may be smaller than a size of the wiring 220. In this regard, FIG. 6 illustrates that a fifth width W5 of the first opening 1801 is smaller than a sixth width W6 of the pixel electrode 210, and a seventh width W7 of the second opening 1802 is smaller than an eighth width W8 of the wiring 220.

Since the region of the pixel electrode 210 exposed through the first opening 1801 is covered with the first photosensitive layer 1100 in the process described above with reference to FIGS. 1 to 6, the region of the pixel electrode 210 is not in contact with the color material constituting the pixel defining layer 180.

As a comparative example, there is a method of forming a pixel defining layer by entirely coating a material for forming the pixel defining layer on a pixel electrode, while omitting a process of forming a first photosensitive layer and a second photosensitive layer, and then exposing and developing the coated material. A portion of the pixel defining layer 180 positioned in a region corresponding to the central portion of the pixel electrode 210 is removed so as to form the first opening, but a residue that is not removed remains on the pixel electrode 210. This residue may cause dark spots. In order to minimize the generation of dark spots, a descum process may be performed to remove the residue. However, when the descum process is performed, the generation of dark spots at the central portion of the pixel electrode 210 is reduced, but dark spots are still generated at the edge portion of the pixel electrode 210, for example, the edge portion of the first opening 1801.

However, according to an embodiment, as the process described above with reference to FIGS. 1 to 6 is performed, the central portion of the pixel electrode 210 is not in contact with the material constituting the pixel defining layer 180. Therefore, it is unnecessary to perform the descum process described above, and it is possible to prevent the generation of dark spots caused by the residue of the material constituting the pixel defining layer 180.

Figure 7A:
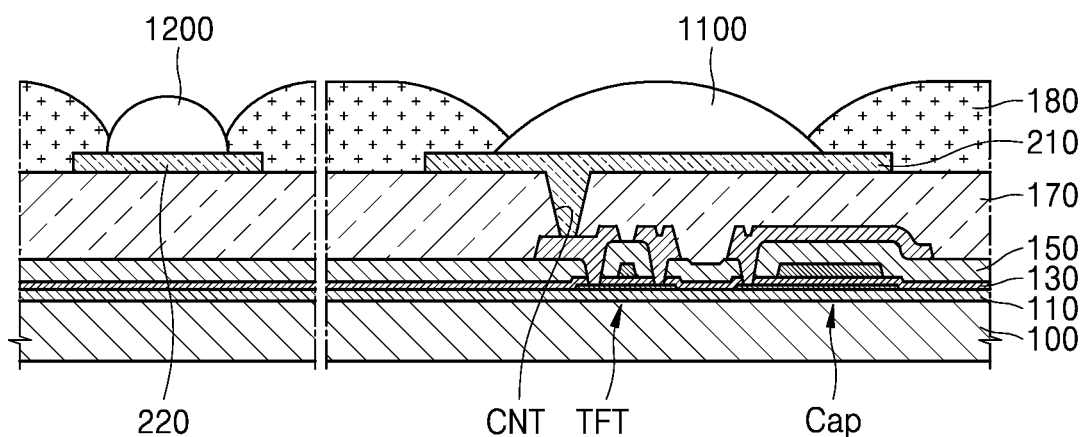
FIGS. 7A to 7C are schematic cross-sectional views illustrating a part of the process of manufacturing the light-emitting display apparatus, according to an embodiment.
Figure 7B:
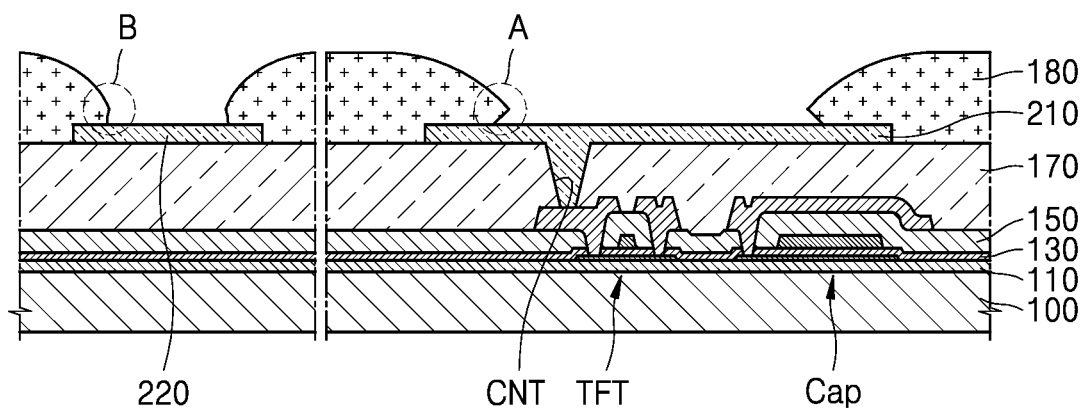
Figure 7C:
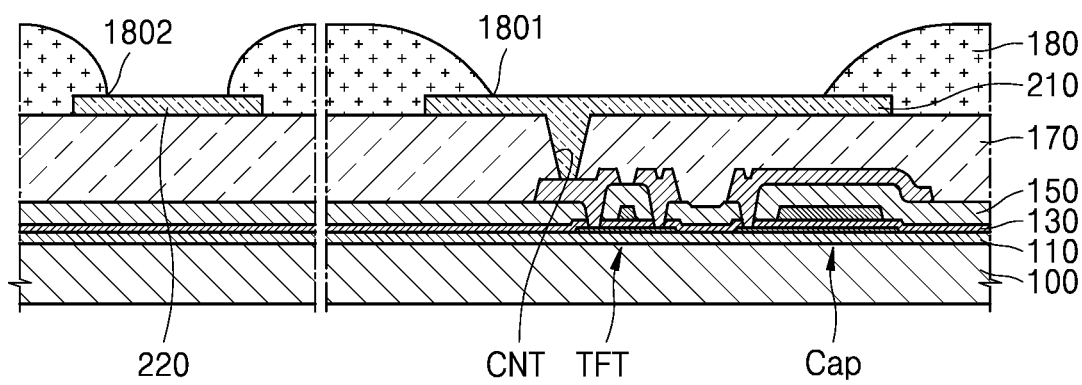

FIGS. 7A to 7C are schematic cross-sectional views illustrating a part of the process of manufacturing the light-emitting display apparatus, according to an embodiment.

In the process described above with reference to FIG. 4, due to factors such as alignment between the substrate 100 and the mask 1400, exposure time, and exposure amount, the color material layer 180M may overlap the edge portion of the first photosensitive layer 1100 as illustrated in FIG. 7A. Similarly, the pixel defining layer 180 may overlap the edge portion of the second photosensitive layer 1200.

As described above with reference to FIG. 5, when the substrate 100 is entirely exposed and then developed, the first photosensitive layer 1100 and the second photosensitive layer 1200 may be removed and the pixel defining layer 180 may include a reverse-tapered inclined surface as illustrated in FIG. 7B (see portion A and portion B of FIG. 7B). In case that the pixel defining layer 180 includes the reverse-tapered surface, a functional layer and/or an opposite electrode to be formed in a subsequent process may be broken. However, according to an embodiment, a part of the pixel defining layer 180 may be reflowed through a curing process that is performed after the first photosensitive layer 1100 and the second photosensitive layer 1200 are removed. Therefore, as illustrated in FIG. 7C, the portions of the pixel defining layer 180 defining the first opening 1801 and the second opening 1802 may include forward-tapered inclined surfaces while being in contact with or connected to the upper surface of the pixel electrode 210 and the upper surface of the wiring 220.

Figure 8:
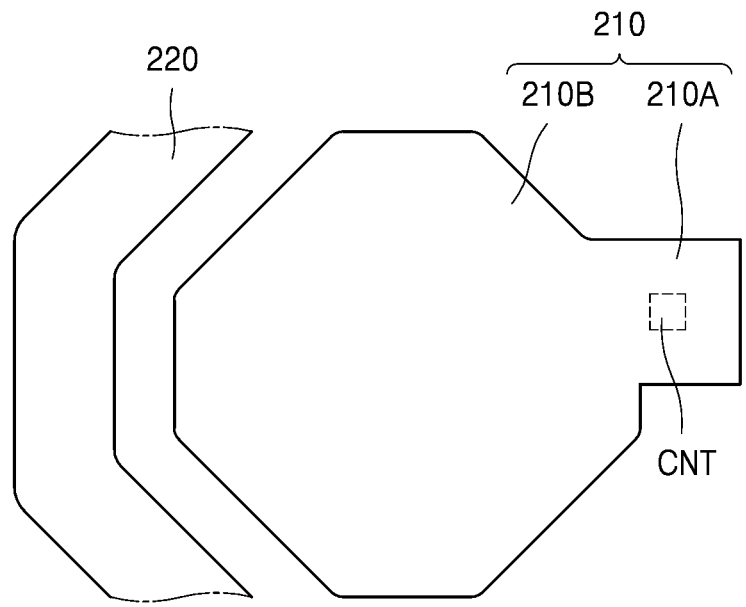
FIG. 8 is a plan view illustrating the process of manufacturing the light-emitting display apparatus, according to an embodiment, which shows a pixel electrode and a wiring.

FIG. 8 is a plan view illustrating the process of manufacturing the light-emitting display apparatus, according to an embodiment, which shows a pixel electrode and a wiring. The plan view of FIG. 8 may correspond to the plan view when the pixel electrode 210 and the wiring 220 formed in the process described above with reference to FIG. 2 are seen in a direction perpendicular to the substrate 100. For convenience of description, the first photosensitive layer 1100 and the second photosensitive layer 1200 illustrated in FIG. 2 are omitted in FIG. 8.

The pixel electrode 210 is an island type and may be spaced apart from the wiring 220. Referring to FIGS. 2 and 8, the pixel electrode 210 may include a first portion 210A for electrical connection with the thin-film transistor TFT, and a second portion 210B connected to the first portion 210A. The first portion 210A is a portion for electrical connection with the thin-film transistor TFT disposed below the pixel electrode 210, and the first portion 210A may be connected to the thin-film transistor TFT through the contact hole CNT. The second portion 210B may be integrally connected to the first portion 210A and may have a relatively larger area than that of the first portion 210A.

Figure 9:
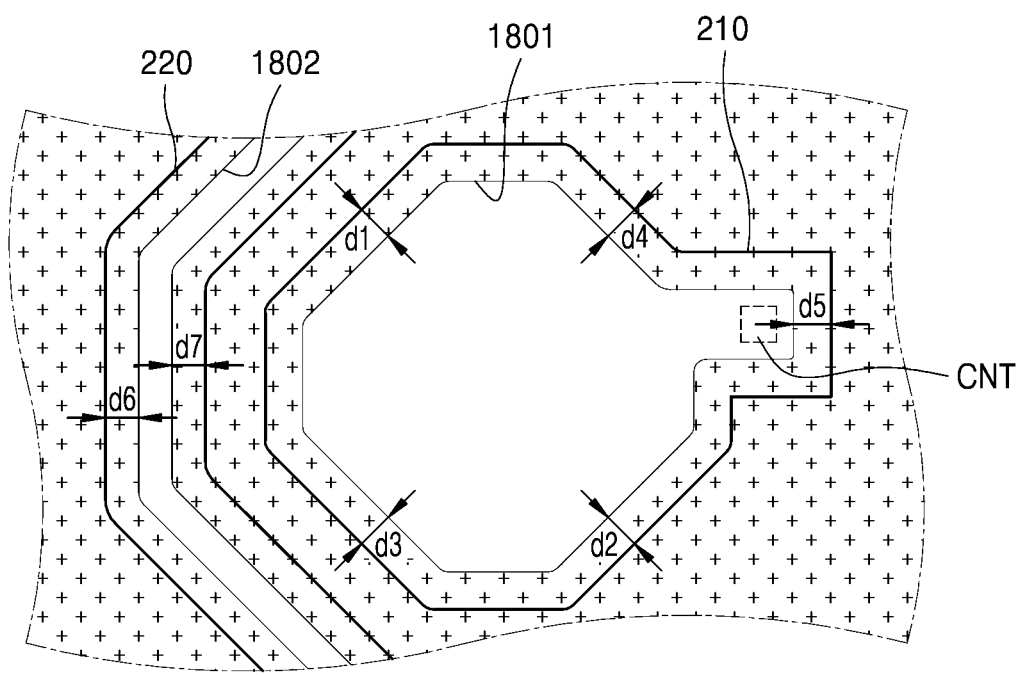
FIG. 9 is a plan view illustrating the process of manufacturing the light-emitting display apparatus, according to an embodiment, which shows a pixel defining layer formed on the pixel electrode and the wiring.

FIG. 9 is a plan view illustrating the process of manufacturing the light-emitting display apparatus, according to an embodiment, which shows the pixel defining layer on the pixel electrode and the wiring. The plan view of FIG. 9 may correspond to the plan view when the cross-sectional structure described above with reference to FIGS. 6 and 7C is seen in a direction perpendicular to the substrate.

The pixel defining layer 180 may be disposed on the pixel electrode 210 and the wiring 220 and may cover the edge portion of the pixel electrode 210 and the edge portion of the wiring 220. The first opening 1801 of the pixel defining layer 180 overlaps the pixel electrode 210, and the second opening 1802 overlaps the wiring 220.

In the process described above with reference to FIGS. 1 to 6 and 7A to 7C, the pixel electrode 210 and the wiring 220 may be formed by the first photosensitive layer 1100 and the second photosensitive layer 1200, and the pixel defining layer 180 having the first opening 1801 and the second opening 1802 may be formed by using the ashed first photosensitive layer 1100 and the ashed second photosensitive layer 1200. Therefore, when seen in a plan view, the first opening 1801 has a size different from that of the pixel electrode 210, but may have substantially the same shape as that of the pixel electrode 210. Similarly, when seen in a plan view, the second opening 1802 has a size different from that of the wiring 220, but may have substantially the same planar shape as that of the wiring 220.

The first opening 1801 may also overlap the contact hole CNT for electrical connection between the pixel electrode 210 and the thin-film transistor TFT (FIGS. 6 and 7C). Edges of the first opening 1801 may be spaced apart from edges of the pixel electrode 210. For example, a first edge of the first opening 1801 and a first edge of the pixel electrode 210, which are adjacent to each other, may be spaced apart by a first distance d1, and a second edge of the first opening 1801 and a second edge of the pixel electrode 210 may be spaced apart by a second distance d2. A third edge of the first opening 1801 and a third edge of the pixel electrode 210 may be spaced apart by a third distance d3, a fourth edge of the first opening 1801 and a fourth edge of the pixel electrode 210 may be spaced apart by a fourth distance d4, and a fifth edge of the first opening 1801 and a fifth edge of the pixel electrode 210 may be spaced apart by a fifth distance d5. Since the pixel defining layer 180 is formed by using the first photosensitive layer 1100 (FIG. 2) that is smaller than the pixel electrode 210 through the ashing as described above, the first to fifth distances d1, d2, d3, d4, and d5 described above may be substantially the same as each other.

Similarly, one edge of the second opening 1802 may be spaced apart from one edge of the wiring 220 by a sixth distance d6, and the other edge of the second opening 1802 may be spaced apart from the other edge of the wiring 220 by a seventh distance d7. The sixth distance d6 and the seventh distance d7 may be substantially the same as each other.

Figure 10A:
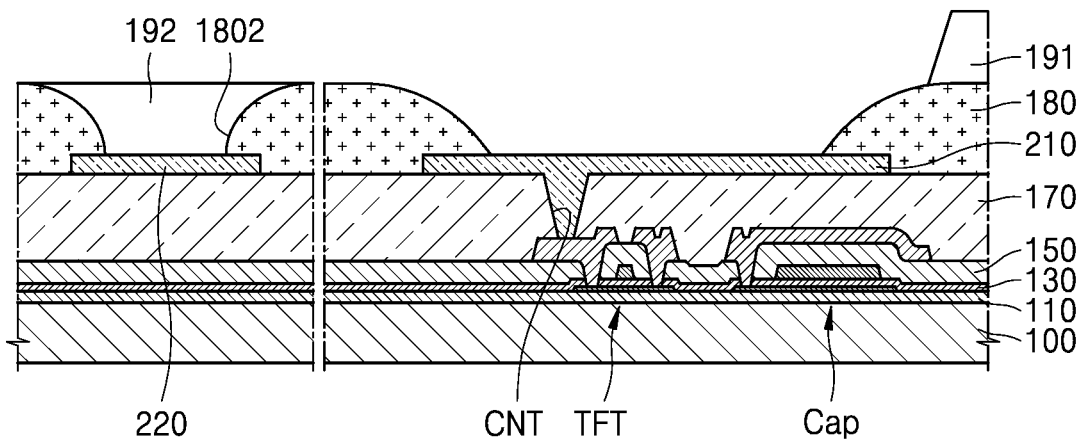
FIGS. 10A to 10C are schematic cross-sectional views illustrating the process of manufacturing the light-emitting display apparatus, according to an embodiment.
Figure 10B:
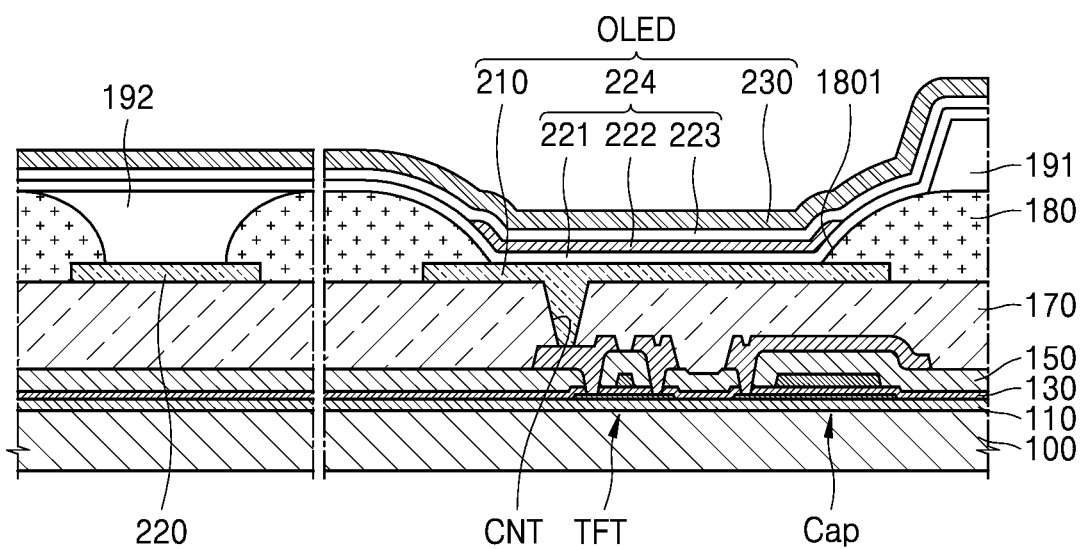
Figure 10C:
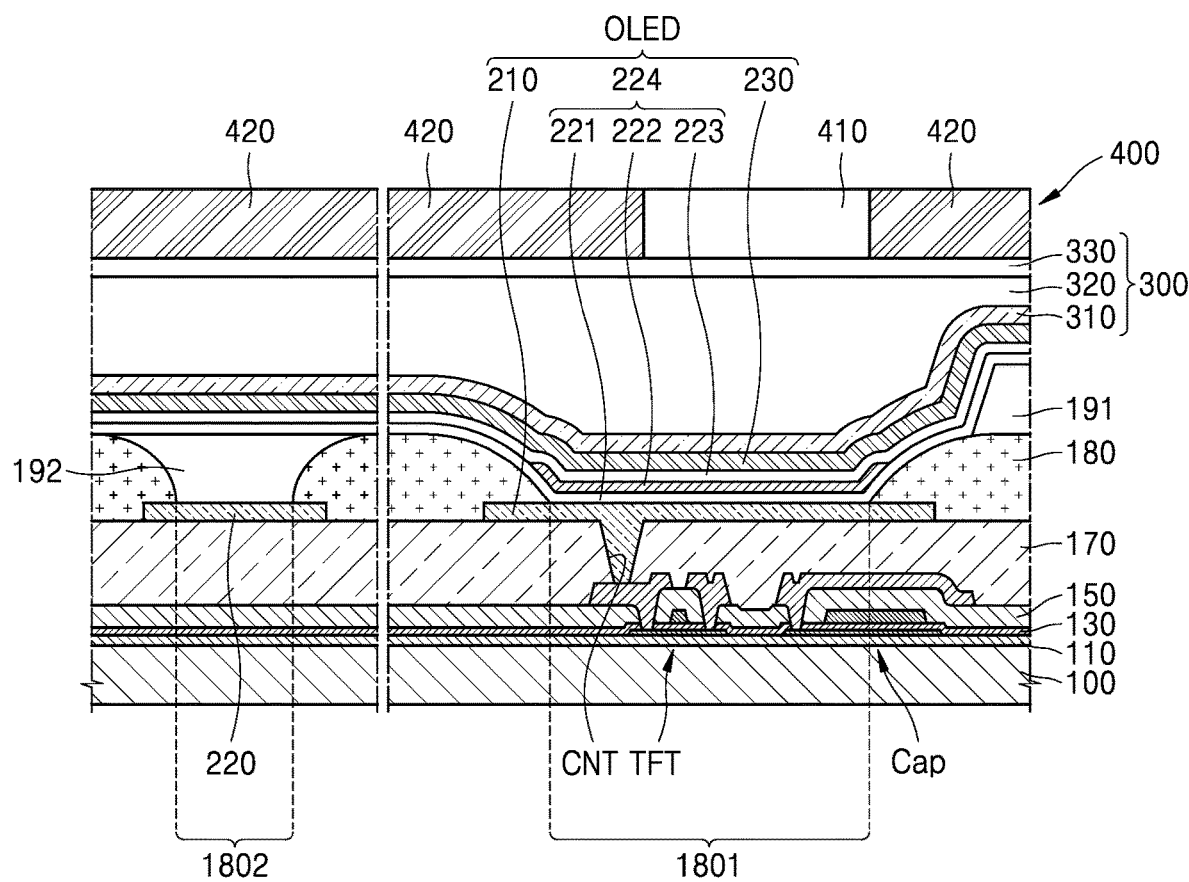

FIGS. 10A to 10C are schematic cross-sectional views illustrating the process of manufacturing the light-emitting display apparatus, according to an embodiment.

Referring to FIG. 10A, a spacer 191 may be formed on the pixel defining layer 180 described above with reference to FIG. 6 or 7C. The spacer 191 may include a material different from that of the pixel defining layer 180. In one embodiment, the spacer 191 may include a polyimide-based resin, for example, a photosensitive polyimide-based resin. The spacer 191 may overlap a material portion other than the opening of the pixel defining layer 180.

In the process of forming the spacer 191, an insulating layer 192 may be formed to cover the second opening 1802. The insulating layer 192 may include a same material as that of the spacer 191. The insulating layer 192 may cover the wiring 220 that is exposed through the second opening 1802. In an embodiment, when the intermediate layer (see FIG. 10B) is formed on the wiring 220 exposed by not forming the insulating layer 192, it may be impossible to provide a signal to be provided to the pixel circuit including the thin-film transistor TFT and the storage capacitor Cap through the wiring 220. Therefore, the insulating layer 192 may be formed to cover the wiring 220.

As illustrated in FIG. 10B, an intermediate layer 224 and an opposite electrode 230 may be formed. The intermediate layer 224 may include a first functional layer 221, an emission layer 222, and a second functional layer 223, which are sequentially stacked. The emission layer 222 may overlap only the pixel electrode 210 and/or the first opening 1801, but the first functional layer 221 and the second functional layer 223 may be formed to cover the entire substrate 100.

The emission layer 222 may include an organic material. The emission layer 222 may include a high-molecular-weight organic material or a low-molecular-weight organic material that emits light of a certain color. The emission layer 222 may be formed through a deposition process using a mask.

The first functional layer 221 may be a single layer or a multi-layer. In case that the first functional layer 221 is formed of a high-molecular-weight material, the first functional layer 221 is a hole transport layer (HTL) having a single-layered structure and may be formed of poly-(3,4)-ethylene-dihydroxy thiophene (PEDOT) or polyaniline (PANI). In case that the first functional layer 221 is formed of a low-molecular-weight material, the first functional layer 221 may include a hole injection layer (HIL) and an HTL. The first functional layer 221 may be formed by, for example, thermal deposition.

The second functional layer 223 may be optional. In case that the first functional layer 221 and the emission layer 222 are formed of a high-molecular-weight material, the second functional layer 223 may be formed. The second functional layer 223 may be a single layer or a multi-layer. The second functional layer 223 may include an electron transport layer (ETL) and/or an electron injection layer (EIL). The second functional layer 223 may be formed by, for example, thermal deposition.

The opposite electrode 230 may be formed of a conductive material having a relatively low work function. For example, the opposite electrode 230 may include a (semi) transparent layer including silver (Ag), magnesium (Mg), aluminum (Al), nickel (Ni), chromium (Cr), lithium (Li), calcium (Ca), and/or any alloy thereof. Alternatively, the opposite electrode 230 may further include a layer such as ITO, IZO, ZnO, or $In_2O_3$ on the (semi)transparent layer including the above-mentioned material. In one embodiment, the opposite electrode 230 may include silver (Ag) and magnesium (Mg). In one embodiment, the opposite electrode 230 may be formed by thermal deposition.

A stacked structure, in which the pixel electrode 210, the intermediate layer 224, and the opposite electrode 230 are sequentially stacked, may form a light-emitting diode, for example, an organic light-emitting diode OLED.

Referring to FIG. 10C, a thin-film encapsulation layer 300 and an optical functional layer 400 may be formed on the organic light-emitting diode OLED.

The thin-film encapsulation layer 300 may include at least one inorganic encapsulation layer and at least one organic encapsulation layer. In one embodiment, the thin-film encapsulation layer 300 may include first and second inorganic encapsulation layers 310 and 330 and an organic encapsulation layer 320 therebetween.

The first and second inorganic encapsulation layers 310 and 330 may each include one or more inorganic insulating materials. The inorganic insulating materials may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through chemical vapor deposition.

The organic encapsulation layer 320 may include a polymer-based material. The polymer-based material may include an acrylic resin, an epoxy-based resin, polyimide, polyethylene, or the like. For example, the organic encapsulation layer 320 may include an acrylic resin such as polymethyl methacrylate, polyacrylic acid, or the like. The organic encapsulation layer 320 may be formed by curing a monomer or coating a polymer.

The optical functional layer 400 is an element that prevents reflection of external light and may include a color filter 410 and a black matrix 420. The light-emitting display apparatus including the optical functional layer 400 including the color filter 410 and the black matrix 420 may significantly reduce the thickness of the light-emitting display apparatus, as compared to a display apparatus including a polarizing plate. In an embodiment, the black matrix 400 may be adjacent to the color filter 410. In another embodiment, the black matrix 400 may surround the color filter 410.

The color filter 410 may overlap the first opening 1801 of the pixel defining layer 180, and light emitted from the organic light-emitting diode OLED passes through the thin-film encapsulation layer 300 and the color filter 410.

The black matrix 420 may overlap the wiring 220 and the second opening 1802, and a part of the black matrix 420 may overlap a part of the first opening 1801. For example, the black matrix 420 may overlap a part of the first opening 1801 and the contact hole CNT. When seen in a direction perpendicular to the substrate 100, the contact hole CNT overlaps the black matrix 420 and is covered with the black matrix 420.

Figure 11:
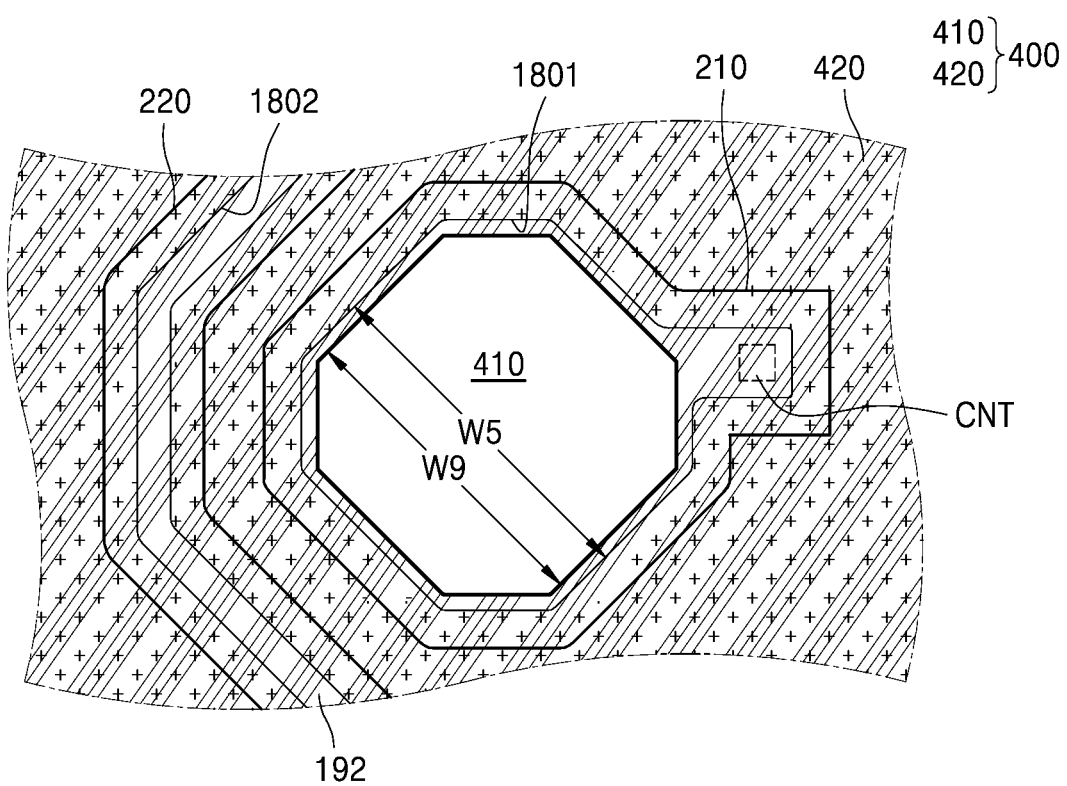
FIG. 11 is a plan view illustrating the process of manufacturing the light-emitting display apparatus, according to an embodiment.

FIG. 11 is a plan view illustrating the process of manufacturing the light-emitting display apparatus, according to an embodiment. FIG. 11 illustrates the structure of the optical functional layer 400 formed on the plan view illustrated in FIG. 9.

Referring to FIG. 11, the color filter 410 of the optical functional layer 400 may overlap the first opening 1801. A ninth width W9 of the color filter 410, which is measured in one direction, may be equal to or smaller than the fifth width W5 of the first opening 1801, which is measured in the one direction as described above. In one embodiment, FIG. 11 illustrates that the ninth width W9 is smaller than the fifth width W5.

The black matrix 420 may overlap the edge portion of the pixel electrode 210 and the contact hole CNT. In addition, the black matrix 420 may overlap the wiring 220, the second opening 1802 overlapping the wiring 220, and the insulating layer 192 covering the second opening 1802.

Figure 12:
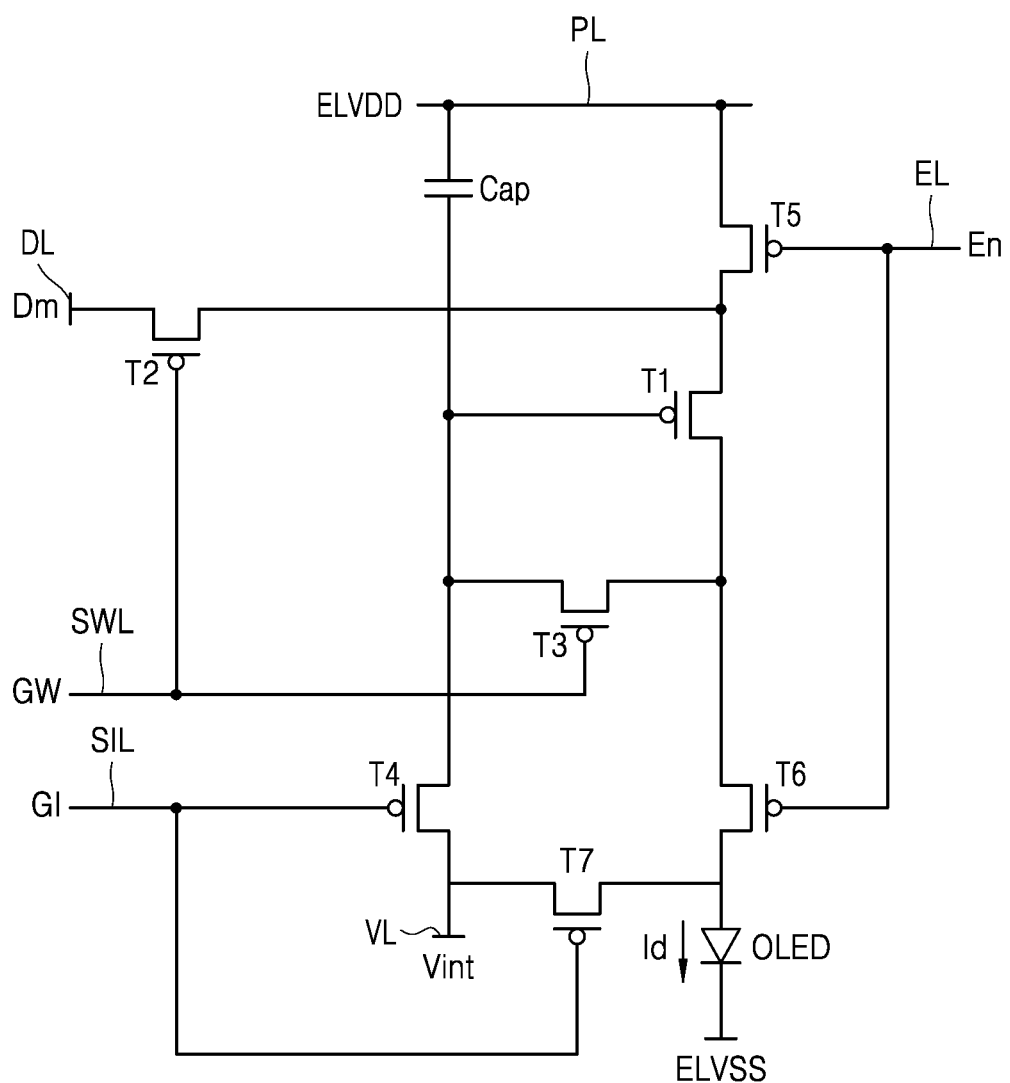
FIG. 12 is a schematic diagram of an equivalent circuit of a pixel illustrating a pixel circuit connected to a light-emitting diode of the light-emitting display apparatus, for example, an organic light-emitting diode, according to an embodiment.

FIG. 12 is a schematic diagram of an equivalent circuit illustrating a pixel circuit connected to a light-emitting diode of the light-emitting display apparatus, for example, an organic light-emitting diode, according to an embodiment.

Referring to FIG. 12, the pixel circuit may include thin-film transistors and a storage capacitor. According to an embodiment, as illustrated in FIG. 12, the thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

A gate electrode of the driving thin-film transistor T1 is electrically connected to an electrode of the storage capacitor Cap. One of a source electrode and a drain electrode of the driving thin-film transistor T1 is electrically connected to a driving voltage line PL through the operation control thin-film transistor T5. The other of the source electrode and the drain electrode of the driving thin-film transistor T1 is electrically connected to the pixel electrode of the organic light-emitting diode OLED through the emission control thin-film transistor T6. The driving thin-film transistor T1 receives a data signal Dm according to a switching operation of the switching thin-film transistor T2 and supplies a driving current Id to the organic light-emitting diode OLED.

A gate electrode of the switching thin-film transistor T2 is electrically connected to a first scan line SWL. One of a source electrode and a drain electrode of the switching thin-film transistor T2 is electrically connected to a data line DL. The other of the source electrode and the drain electrode of the switching thin-film transistor T2 is electrically connected to the driving thin-film transistor T1 and electrically connected to the driving voltage line PL through the operation control thin-film transistor T5. The switching thin-film transistor T2 is turned on according to a scan signal GW received through the first scan line SWL and performs a switching operation to transfer the data signal Dm received through the data line DL to the driving thin-film transistor T1.

A gate electrode of the compensation thin-film transistor T3 is electrically connected to the first scan line SWL. One of a source electrode and a drain electrode of the compensation thin-film transistor T3 is electrically connected to the driving thin-film transistor T1 and electrically connected to the pixel electrode of the organic light-emitting diode OLED through the emission control thin-film transistor T6. The other of the source electrode and the drain electrode of the compensation thin-film transistor T3 is electrically connected to the electrode of the storage capacitor Cap, the first initialization thin-film transistor T4, and the driving thin-film transistor T1. The compensation thin-film transistor T3 is turned on according to the scan signal GW received through the first scan line SWL and electrically connects the gate electrode of the driving thin-film transistor T1 to one of the source electrode and the drain electrode thereof (for example, the drain electrode) to diode-connect the driving thin-film transistor T1.

A gate electrode of the first initialization thin-film transistor T4 is electrically connected to a second scan line SIL. One of a source electrode and a drain electrode of the first initialization thin-film transistor T4 is electrically connected to the second initialization thin-film transistor T7 and an initialization voltage line VL. The other of the source electrode and the drain electrode of the first initialization thin-film transistor T4 is electrically connected to the electrode of the storage capacitor Cap, the compensation thin-film transistor T3, and the driving thin-film transistor T1. The first initialization thin-film transistor T4 is turned on according to a previous scan signal GI received through the second scan line SIL and performs an initialization operation to transfer an initialization voltage Vint to the gate electrode of the driving thin-film transistor T1 to initialize the voltage of the gate electrode of the driving thin-film transistor T1.

A gate electrode of the operation control thin-film transistor T5 is electrically connected to an emission control line EL. One of a source electrode and a drain electrode of the operation control thin-film transistor T5 is electrically connected to the driving voltage line PL. The other of the source electrode and the drain electrode of the operation control thin-film transistor T5 is electrically connected to the driving thin-film transistor T1 and the switching thin-film transistor T2.

A gate electrode of the emission control thin-film transistor T6 is electrically connected to the emission control line EL. One of a source electrode and a drain electrode of the emission control thin-film transistor T6 is electrically connected to the driving thin-film transistor T1 and a compensation source electrode of the compensation thin-film transistor T3. The other of the source electrode and the drain electrode of the emission control thin-film transistor T6 is electrically connected to the second initialization thin-film transistor T7 and the pixel electrode of the organic light-emitting diode OLED.

The operation control thin-film transistor T5 and the emission control thin-film transistor T6 are simultaneously turned on according to an emission control signal En received through the emission control line EL and transfers a driving voltage ELVDD to the organic light-emitting diode OLED so that the driving current Id flows through the organic light-emitting diode OLED.

A gate electrode of the second initialization thin-film transistor T7 is electrically connected to the second scan line SIL. One of a source electrode and a drain electrode of the second initialization thin-film transistor T7 is electrically connected to the emission control thin-film transistor T6 and the pixel electrode of the organic light-emitting diode OLED. The other of the source electrode and the drain electrode of the second initialization thin-film transistor T7 is electrically connected to the first initialization thin-film transistor T4 and the initialization voltage line VL. The second initialization thin-film transistor T7 is turned on according to a previous scan signal GI received through the second scan line SIL and initializes the pixel electrode of the organic light-emitting diode OLED.

An embodiment where the first initialization thin-film transistor T4 and the second initialization thin-film transistor T7 are electrically connected to the second scan line SIL is illustrated in FIG. 12, but embodiments are not limited thereto. In another embodiment, the first initialization thin-film transistor T4 may be electrically connected to the second scan line SIL and driven according to the previous scan signal GI, the second initialization thin-film transistor T7 may be electrically connected to the first scan line or the second scan line of the pixel arranged (or disposed) in a previous row or a next row of the pixel P.

One electrode of the storage capacitor Cap is electrically connected to the driving voltage line PL, and the opposite electrode of the organic light-emitting diode OLED is electrically connected to a common voltage ELVSS. Therefore, the organic light-emitting diode OLED may receive the driving current Id from the driving thin-film transistor T1 and emit light to display an image.

An embodiment where the pixel circuit PC includes seven thin-film transistors and one storage capacitor has been described with reference to FIG. 12, but embodiments are not limited thereto. The number of thin-film transistors and the number of storage capacitors may be variously changed according to the design of the pixel circuit PC.

The wiring 220 described above with reference to FIG. 11 may be one of the lines described above with reference to FIG. 12, for example, the driving voltage line PL, the initialization voltage line VL, and the data line DL. For example, the wiring 220 may correspond to the initialization voltage line VL configured to provide the initialization voltage Vint.

In another embodiment, the wiring 220 may correspond to a line configured to provide signals or voltages different from those of the lines (for example, the driving voltage line, the initialization voltage line, the data line, and the like) connected to the pixel circuit. The structure of the cross section and the plane on the wiring 220 may be different from the structure described above with reference to FIGS. 10C and 11, and the structure will be described with reference to FIGS. 13A to 13C and 14.

FIGS. 13A to 13E are schematic cross-sectional views illustrating the process of manufacturing the light-emitting display apparatus, according to an embodiment.

Figure 13A:
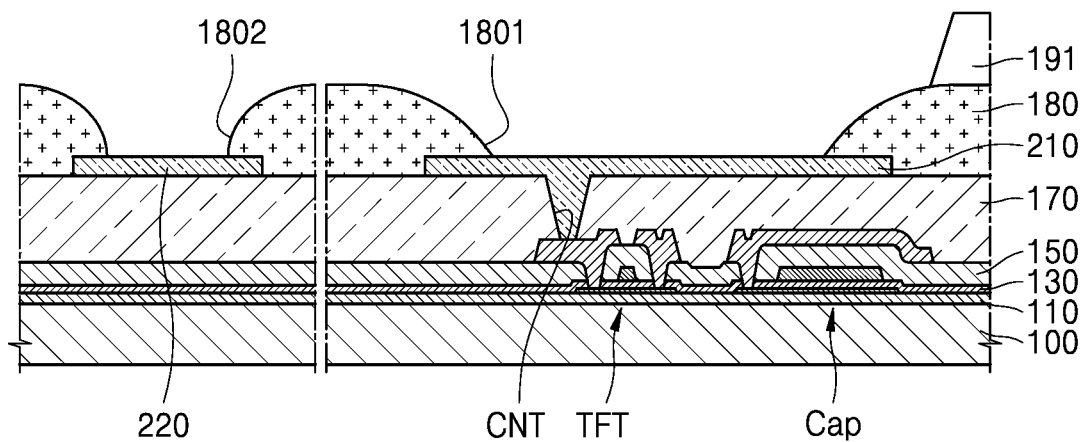
FIGS. 13A to 13E are schematic cross-sectional views illustrating the process of manufacturing the light-emitting display apparatus, according to an embodiment.

Referring to FIG. 13A, a spacer 191 may be formed on the pixel defining layer 180 described above with reference to FIG. 6 or 7C. The spacer 191 may include a material different from that of the pixel defining layer 180. In one embodiment, the spacer 191 may include a polyimide-based resin, for example, a photosensitive polyimide-based resin. The spacer 191 may overlap a material portion other than the opening of the pixel defining layer 180, for example, the first opening 1801 and the second opening 1802.

Figure 13B:
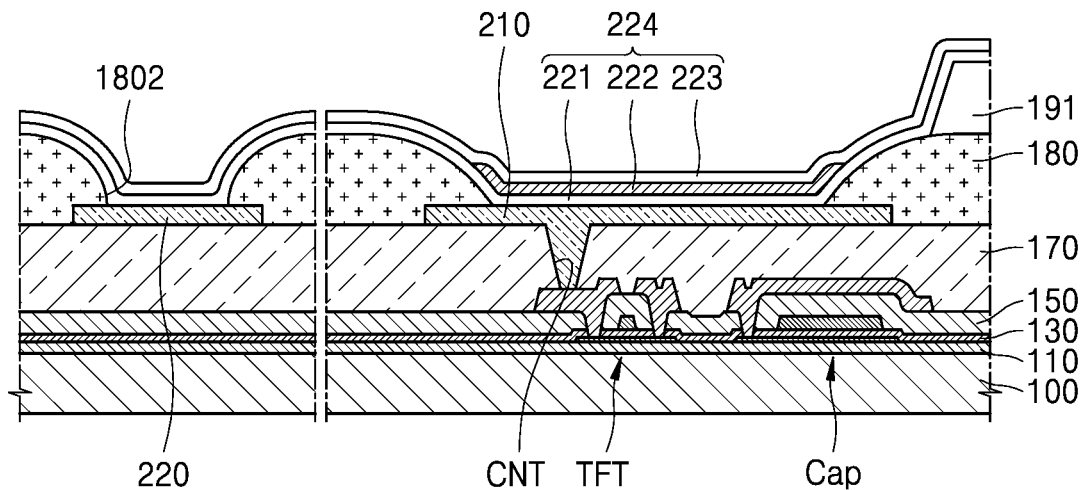

As illustrated in FIG. 13B, an intermediate layer 224 may be formed. The intermediate layer 224 may include a first functional layer 221, an emission layer 222, and a second functional layer 223, which are sequentially stacked. The emission layer 222 may overlap the pixel electrode 210, but the first functional layer 221 and the second functional layer 223 may be formed to cover the entire substrate 100.

Materials of the emission layer 222, the first functional layer 221, and the second functional layer 223 are the same as those described above.

A part of the intermediate layer 224, for example, the first functional layer 221 and/or the second functional layer 223, may be positioned on the wiring 220 through the second opening 1802. The first functional layer 221 may be in direct contact with the wiring 220 through the second opening 1802.

Figure 13C:
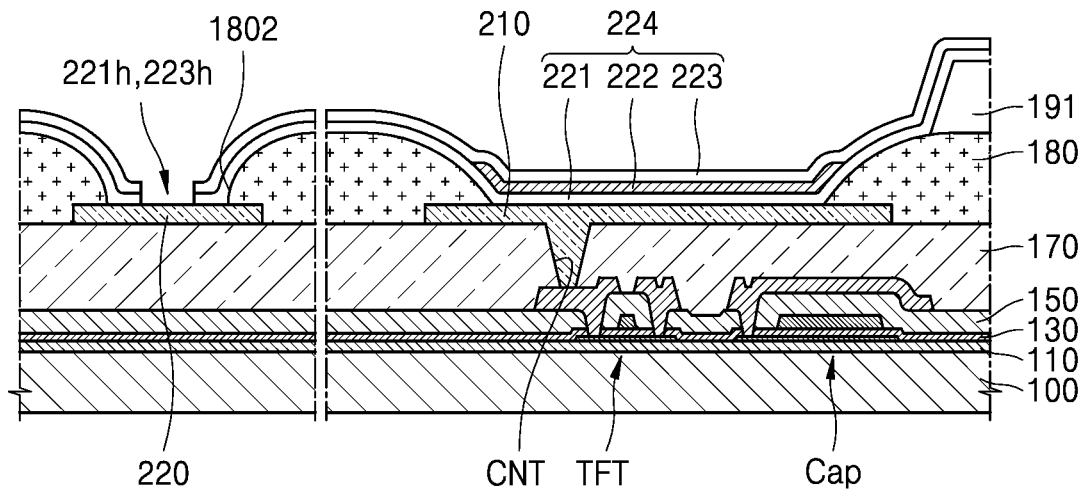

As illustrated in FIG. 13C, a portion of the first functional layer 221 on the wiring 220 and a portion of the second functional layer 223 on the wiring 220 may be removed to form a first hole 221h of the first functional layer 221 and a second hole 223h of the functional layer 223. The first hole 221h and the second hole 223h may overlap the second opening 1802, and the wiring 220 may be exposed through the first hole 221h and the second hole 223h. The first hole 221h and the second hole 223h may be formed by irradiating a laser beam.

Figure 13D:
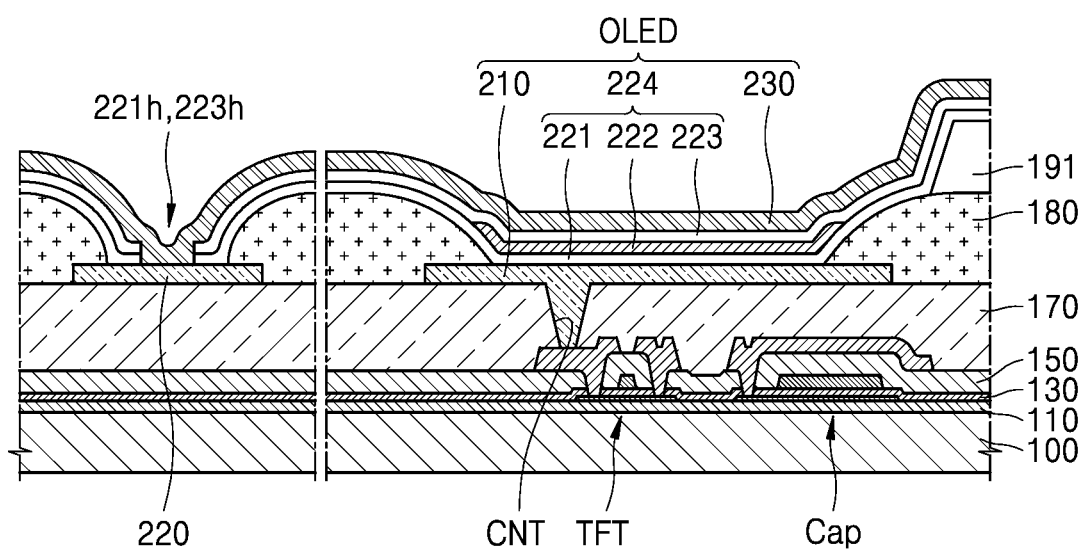

As illustrated in FIG. 13D, an opposite electrode 230 is formed. A material of the opposite electrode 230 is the same as that described above.

A stacked structure, in which the pixel electrode 210, the intermediate layer 224, and the opposite electrode 230 are sequentially stacked, may form a light-emitting diode, for example, an organic light-emitting diode OLED. A part of the opposite electrode 230 may be electrically connected to the wiring 220. A part of the opposite electrode 230 may be in direct contact with the wiring 220 exposed through the first hole 221h and the second hole 223h. The wiring 220 may be a bus line capable of providing the common voltage ELVSS (FIG. 12). When the light-emitting display apparatus has a relatively large size, bus lines may be disposed adjacent to pixel electrodes in a display area so as to prevent voltage drop of the opposite electrode. The display area refers to an image plane or a screen area on which the light-emitting display apparatus is capable of providing an image. The wiring 220 illustrated in FIG. 13D may correspond to the bus line described above and may be configured to provide the common voltage ELVSS to the opposite electrode 230.

Figure 13E:
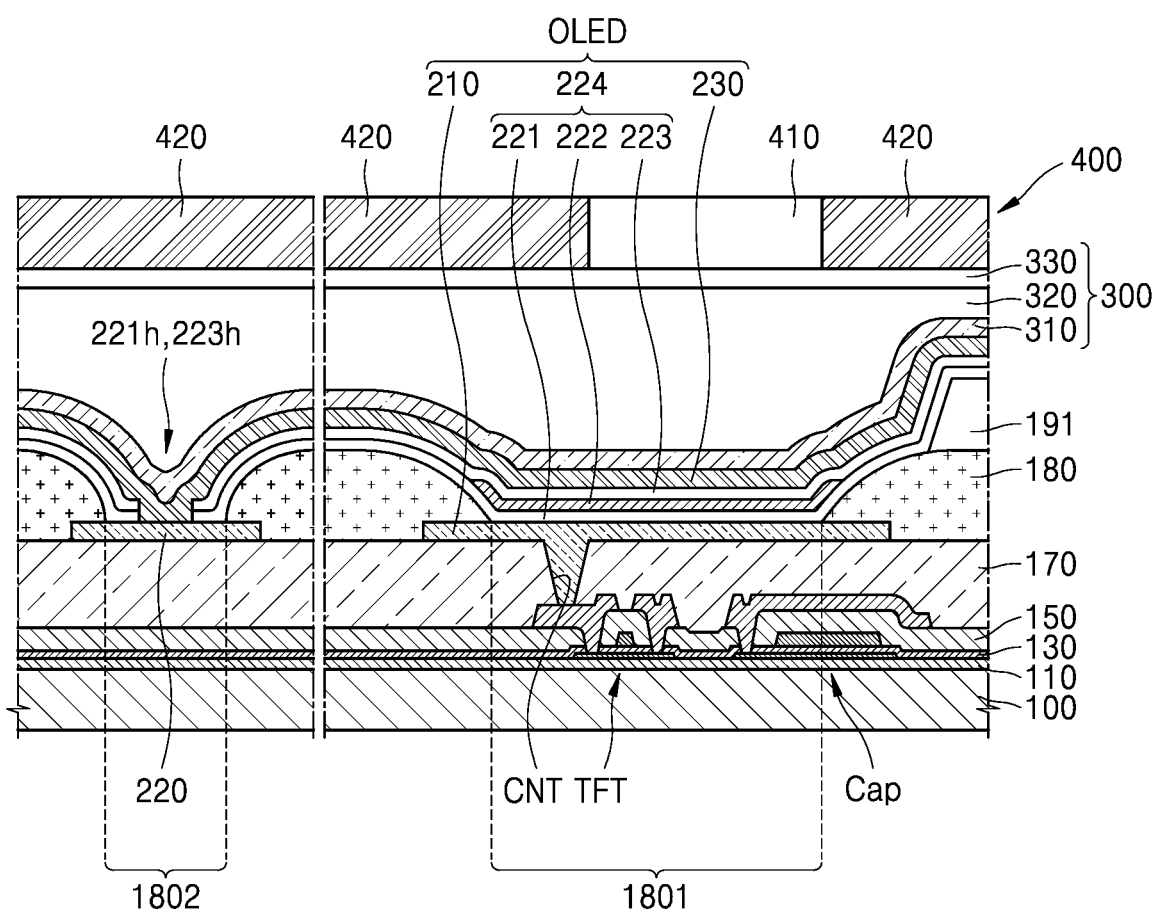

As illustrated in FIG. 13E, a thin-film encapsulation layer 300 and an optical functional layer 400 may be formed on the organic light-emitting diode OLED. The detailed structures of the thin-film encapsulation layer 300 and the optical functional layer 400 are the same as those described above with reference to FIG. 10C.

The color filter 410 may overlap the first opening 1801 of the pixel defining layer 180, and light emitted from the organic light-emitting diode OLED passes through the thin-film encapsulation layer 300 and the color filter 410.

The black matrix 420 may overlap the wiring 220 and the second opening 1802, and a part of the black matrix 420 may overlap a part of the first opening 1801. The black matrix 420 may overlap a part of the first opening 1801 and the contact hole CNT. When seen in a direction perpendicular to the substrate 100, the contact hole CNT overlaps the black matrix 420 and is covered with the black matrix 420.

Figure 14:
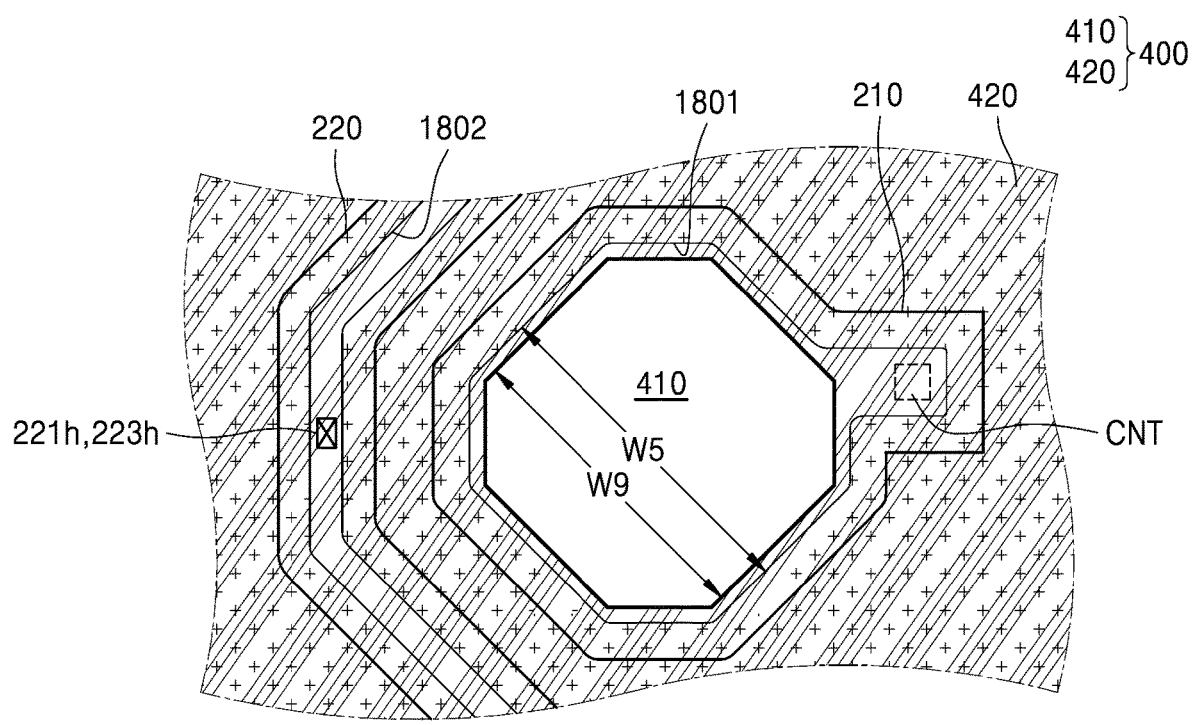
FIG. 14 is a plan view illustrating the process of manufacturing the light-emitting display apparatus, according to an embodiment.

FIG. 14 is a plan view illustrating the process of manufacturing the light-emitting display apparatus, according to an embodiment. FIG. 14 may correspond to a planar structure when the structure illustrated in FIG. 13E is seen in a direction perpendicular to the substrate 100.

Referring to FIG. 14, the color filter 410 of the optical functional layer 400 may overlap the first opening 1801. The ninth width W9 of the color filter 410, which is measured in the same direction, may be equal to or smaller than the fifth width W5 of the first opening 1801. In one embodiment, FIG. 14 illustrates that the ninth width W9 is smaller than the fifth width W5.

The black matrix 420 may overlap the edge portion of the pixel electrode 210 and the contact hole CNT. The black matrix 420 may overlap the wiring 220, the second opening 1802 overlapping the wiring 220, and the first hole 221h and the second hole 223h overlapping the second opening 1802.

The embodiments may provide the light-emitting display apparatus capable of preventing generation of dark spots without an increase of masks and preventing deterioration of contrast.

It should be understood that embodiments described herein should be considered in a descriptive sense only and not for purposes of limitation. Descriptions of features or aspects within each embodiment should typically be considered as available for other similar features or aspects in other embodiments. While the embodiments have been described with reference to the figures, it will be understood by those of ordinary skill in the art that various changes in form and details may be made therein without departing from the spirit and scope as defined by the following claims.

What is claimed is:

1. A method of manufacturing a light-emitting display apparatus, the method comprising:
   forming a first photosensitive layer on a conductive material layer;
   forming a pixel electrode by etching the conductive material layer by using the first photosensitive layer as a mask;
   ashing the first photosensitive layer disposed on the pixel electrode;
   forming a pixel defining layer that covers an edge portion of the pixel electrode and includes a first opening overlapping the ashed first photosensitive layer;
   removing the ashed first photosensitive layer disposed in the first opening;
   forming an intermediate layer including a functional layer and an emission layer on the pixel defining layer; and
   forming an opposite electrode on the intermediate layer.

2. The method of claim 1, wherein the forming of the pixel defining layer comprises:
   forming a color material layer on the ashed first photosensitive layer;
   exposing a part of the color material layer; and
   forming the first opening by developing the exposed part of the color material layer.

3. The method of claim 2, wherein the pixel defining layer comprises a negative photosensitive material.

4. The method of claim 3, further comprising:
   curing the pixel defining layer after the forming of the first opening.

5. The method of claim 3, wherein the pixel defining layer further comprises a color pigment or carbon black.

6. The method of claim 1, wherein a shape of the first opening is substantially same as a shape of the pixel electrode in a plan view.

7. The method of claim 1, further comprising:
   forming a thin-film transistor; and
   forming an insulating layer between the thin-film transistor and the pixel electrode, wherein
   the forming of the insulating layer includes forming a contact hole for electrical connection between the thin-film transistor and the pixel electrode, and
   the first opening overlaps the contact hole.

8. The method of claim 7, further comprising:
forming an optical functional layer comprising a color filter overlapping the first opening and a black matrix adjacent to the color filter, wherein
the black matrix overlaps the contact hole.

9. The method of claim 1, further comprising:
forming a second photosensitive layer on the conductive material layer; and
forming a wiring by etching the conductive material layer using the second photosensitive layer as a mask.

10. The method of claim 9, further comprising:
ashing the second photosensitive layer disposed on the wiring, wherein
the forming of the pixel defining layer comprises forming a second opening overlapping the ashed second photosensitive layer and spaced apart from the first opening.

11. The method of claim 10, further comprising:
removing the ashed second photosensitive layer from the second opening.

12. The method of claim 11, further comprising:
forming an insulating layer overlapping the second opening and disposed between the wiring and the intermediate layer.

13. The method of claim 11, further comprising:
forming a hole in a portion of the functional layer, which overlaps the wiring,
wherein the opposite electrode is formed to be in electrical contact with the wiring through the hole.

* * * * *